United States Patent
Lee

(10) Patent No.: US 8,343,843 B2
(45) Date of Patent: Jan. 1, 2013

(54) MONOLITHIC MICROWAVE INTEGRATED CIRCUIT DEVICE AND METHOD FOR FORMING THE SAME

(75) Inventor: Jongmin Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 309 days.

(21) Appl. No.: 12/795,138

(22) Filed: Jun. 7, 2010

(65) Prior Publication Data

US 2011/0133250 A1    Jun. 9, 2011

(30) Foreign Application Priority Data

Dec. 9, 2009   (KR) .................. 10-2009-0121660

(51) Int. Cl.
*H01L 21/8222*     (2006.01)
(52) U.S. Cl. .......... 438/329; 257/E21.608; 257/E27.019
(58) Field of Classification Search .................. 438/329; 257/E21.608, E27.019, E27.02, E27.021
See application file for complete search history.

(56) References Cited

U.S. PATENT DOCUMENTS

| | | | | |
|---|---|---|---|---|
| 5,268,315 A | * | 12/1993 | Prasad et al. | 438/314 |
| 5,953,617 A | * | 9/1999 | Lee | 438/329 |
| 6,833,606 B2 | | 12/2004 | Nakamura et al. | |

FOREIGN PATENT DOCUMENTS

| | | |
|---|---|---|
| JP | 2001-326284 A | 11/2001 |
| KR | 10-0262409 B1 | 5/2000 |
| KR | 10-0296705 B1 | 5/2001 |
| KR | 10-0328148 | 2/2002 |
| KR | 10-0518451 | 9/2005 |

* cited by examiner

*Primary Examiner* — Daniel Whalen
(74) *Attorney, Agent, or Firm* — Rabin & Berdo, P.C.

(57) ABSTRACT

Provided are a monolithic microwave integrated circuit device and a method for forming the same. The method include: forming an HBT on a substrate; forming a wiring of the HBT and a bottom electrode of a capacitor on the substrate, with a first metal, the bottom electrode being spaced apart from the HBT; forming a first insulation layer on the substrate to cover the HBT and the bottom electrode; and forming a top electrode of the capacitor on the first insulation layer and forming a resistance pattern on the substrate, with a second metal, the resistance pattern being spaced apart from the capacitor, wherein an edge of the top electrode is spaced apart from an edge of the bottom electrode.

10 Claims, 15 Drawing Sheets

MONOLITHIC MICROWAVE INTEGRATED CIRCUIT DEVICE AND METHOD FOR FORMING THE SAME

CROSS-REFERENCE TO RELATED APPLICATIONS

This U.S. non-provisional patent application claims priority under 35 U.S.C. §119 of Korean Patent Application No. 10-2009-0121660, filed on Dec. 9, 2009, the entire contents of which are hereby incorporated by reference.

BACKGROUND OF THE INVENTION

The present invention disclosed herein relates to a monolithic microwave integrated circuit device and more particularly to, a monolithic microwave integrated circuit device including a heterojunction bipolar transistor (HBT) and a method for forming the same.

A bipolar transistor may be used as an ultrahigh frequency semiconductor device in an ultrahigh-speed broadband communication network. Recently, researches for realizing a faster ultrahigh-speed operation by reducing a parasite component of the above device have been being made. Especially, the HBT may be used as a basic device of a power transistor and a power amplifier.

For manufacturing a value-added integrated circuit, a Monolithic Microwave Integrated Circuit (MMIC) technology is used, through which passive devices such as a capacitor, a resistor, an inductor in addition to the HBT (i.e., an active device) are integrated into the same chip. The MMIC technology can integrate passive devices into the same chip to reduce a chip size and also can reduce unnecessary parasite effect to improve circuit performance. This MMIC technology needs to pay great attention to manufacturing processes since diverse active and passive devices are manufactured in a single substrate.

SUMMARY OF THE INVENTION

The present invention provides a method for stably forming a Heterojunction Bipolar Transistor (HBT), a capacitor, and a resistance pattern in a monolithic microwave integrated circuit device.

Embodiments of the present invention provide methods for forming a monolithic microwave integrated circuit device, the methods including: forming a Heterojunction Bipolar Transistor (HBT) on a substrate; forming a wiring of the HBT and a bottom electrode of a capacitor on the substrate, with a first metal, the bottom electrode being spaced apart from the HBT; forming a first insulation layer on the substrate to cover the HBT and the bottom electrode; and forming a top electrode of the capacitor on the first insulation layer and forming a resistance pattern on the substrate, with a second metal, the resistance pattern being spaced apart from the capacitor, wherein an edge of the top electrode is spaced apart from an edge of the bottom electrode.

In some embodiments, an area of the top electrode may be less than that of the bottom electrode.

In other embodiments, the methods may further include: forming a second insulation layer on the top electrode; exposing a top surface of the top electrode by patterning the second insulation layer; and forming a capacitor wiring on the top electrode and forming a resistance pattern wiring on the resistance pattern, with a third metal.

In still other embodiments, the forming of the HBT may include: sequentially forming a preliminary sub-collector layer, a preliminary collector layer, a preliminary base layer, a preliminary emitter layer, and a preliminary emitter cap layer on the substrate; and forming a sub-collector layer, a collector layer, a base layer, an emitter layer, and an emitter cap layer by patterning the preliminary sub-collector layer, the preliminary collector layer, the preliminary base layer, the preliminary emitter layer, and the preliminary emitter cap layer.

In even other embodiments, the methods may further include a collector electrode, a base electrode, and an emitter electrode on the sub-collector layer, the base layer, and the emitter cap layer, respectively.

In yet other embodiments, the forming of the collector electrode, the base electrode, and the emitter electrode may be performed using a lift off process.

In further embodiments, after the forming of the collector electrode, the base electrode, and the emitter electrode, the methods may further include conformally forming a third insulation layer to cover the collector electrode, the base electrode, and the emitter electrode.

In still further embodiments, the methods may further include exposing at least a portion of a top surface of the collector electrode, the base electrode, and the emitter electrode by forming a via hole in the third insulation layer.

In even further embodiments, the forming of the wiring of the HBT and the forming of the bottom electrode of the capacitor on the substrate, with the first metal, and the forming of the top electrode of the capacitor on the first insulation layer and the forming of the resistance pattern on the substrate, with the second metal, may be performed using a lift off process.

In yet further embodiments, the top electrode may be formed being thinner than the bottom electrode.

In other embodiments of the present invention, monolithic microwave integrated circuit devices include: a HBT provided on a substrate; a capacitor spaced apart from the HBT on the substrate and including a bottom electrode, a first insulation layer, and a top electrode; and a resistance pattern spaced apart from the capacitor on the substrate, wherein a wiring of the HBT and the bottom electrode are same material and the top electrode and the resistance pattern are same material, wherein an edge of the top electrode is spaced apart from an edge of the bottom electrode.

In some embodiments, an area of the top electrode may be less than that of the bottom electrode.

In other embodiments, the devices may further include a second insulation pattern provided on the first insulation layer.

In still other embodiments, the second insulation pattern may expose at least a portion of a top surfaces of the top electrode and a top surface of the resistance pattern.

In even other embodiments, the devices may further include: a capacitor wiring provided on the top electrode; and a resistance pattern wiring provided on the resistance pattern.

In yet other embodiments, the capacitor wiring and the resistance pattern wiring may be same material.

In further embodiments, the HBT may include a sub-collector layer, a collector layer, a base layer, an emitter layer, and an emitter cap layer, which are sequentially stacked on the substrate.

In still further embodiments, the device may further include: a collector electrode, a base electrode, and emitter electrode, which are provided on the sub-collector layer, the base layer, and the emitter cap layer, respectively.

In even further embodiments, the first insulation layer may be conformally provided on the substrate.

In yet further embodiments, the devices may further include a third insulation layer between the substrate and the first insulation layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
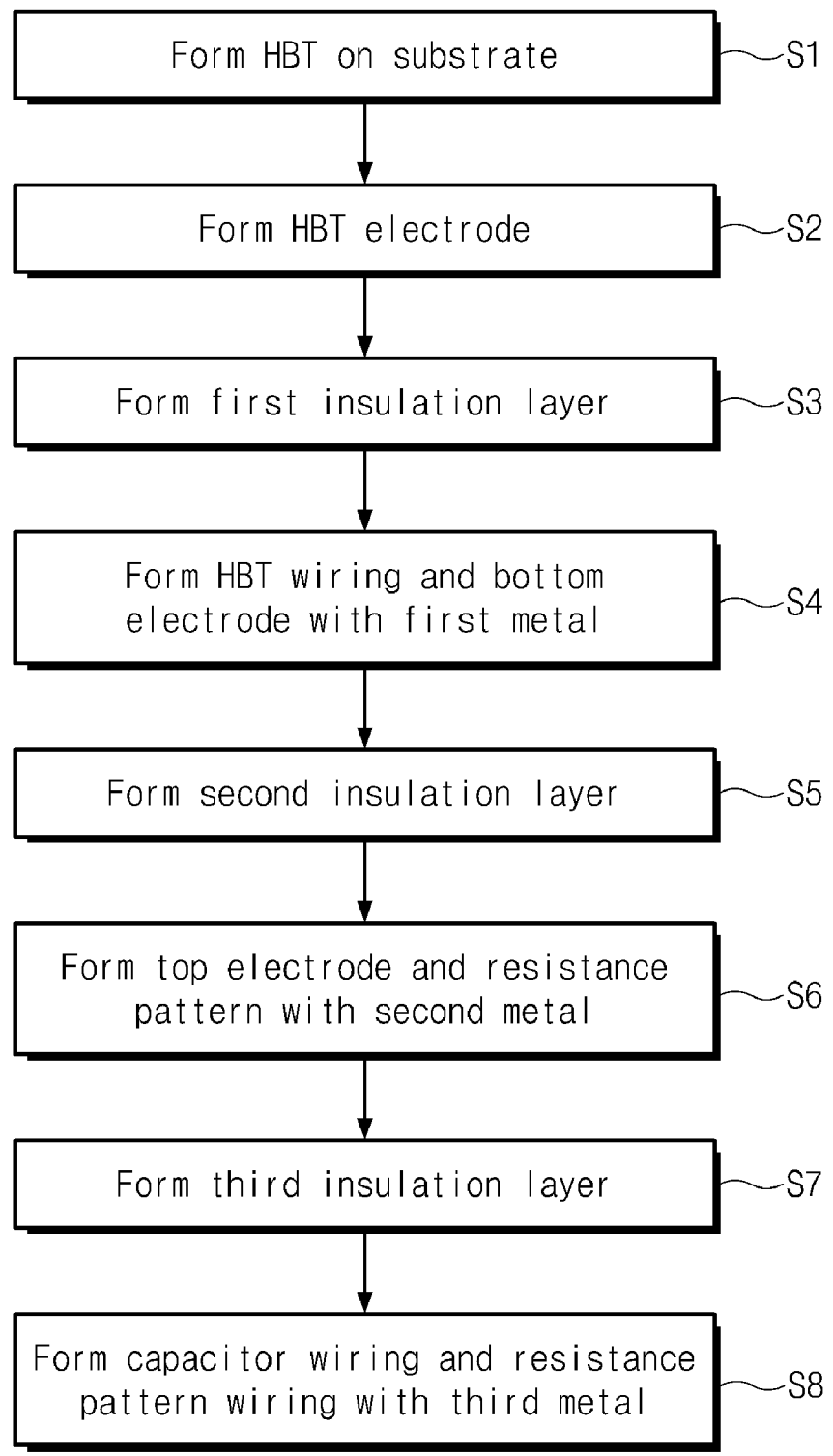
FIG. 1 is a manufacturing flowchart illustrating a method for forming a monolithic microwave integrated circuit device according to an embodiment of the present invention.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the specification, when it is mentioned that a certain material layer such as a conductive layer, a semiconductor layer, or an insulation layer is disposed "on" another material or a substrate, the certain material layer may be directly formed on the another material layer or the substrate, or another material layer may be interposed therebetween. In various embodiments of the present invention, although terms such as a first, a second, and a third are used to describe a specific operation, this just distinguishes a specific operation from other operations, but the present invention is not limited to those terms.

In the following description, the technical terms are used only for explaining a specific exemplary embodiment while not limiting the present invention. The terms of a singular form may include plural forms unless referred to the contrary. The meaning of 'comprises' and/or 'comprising' specifies a property, a region, a fixed number, a step, a process, an element and/or a component but does not exclude other properties, regions, fixed numbers, steps, processes, elements and/or components.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Thus, this should not be construed as limited to the scope of the present invention.

FIGS. 1 through 16 are views illustrating a monolithic microwave integrated circuit device and a method for forming the same according to an embodiment of the present invention.

Figure 2:
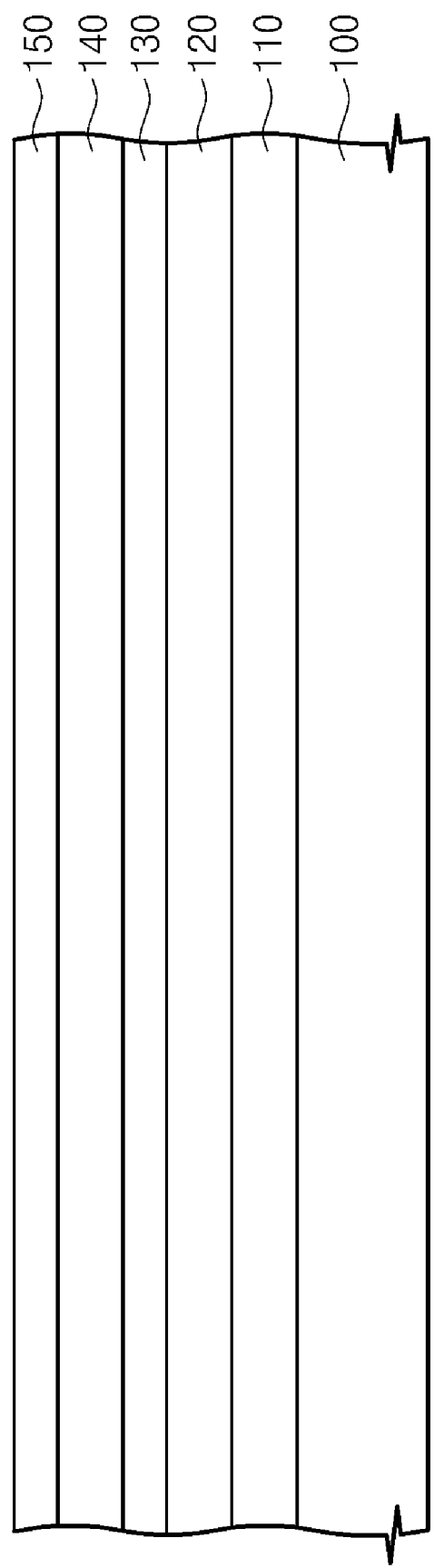
FIGS. 2 through 16 are sectional views and plan views illustrating a monolithic microwave integrated circuit device and a method for forming the same according to an embodiment of the present invention.
Figure 5:
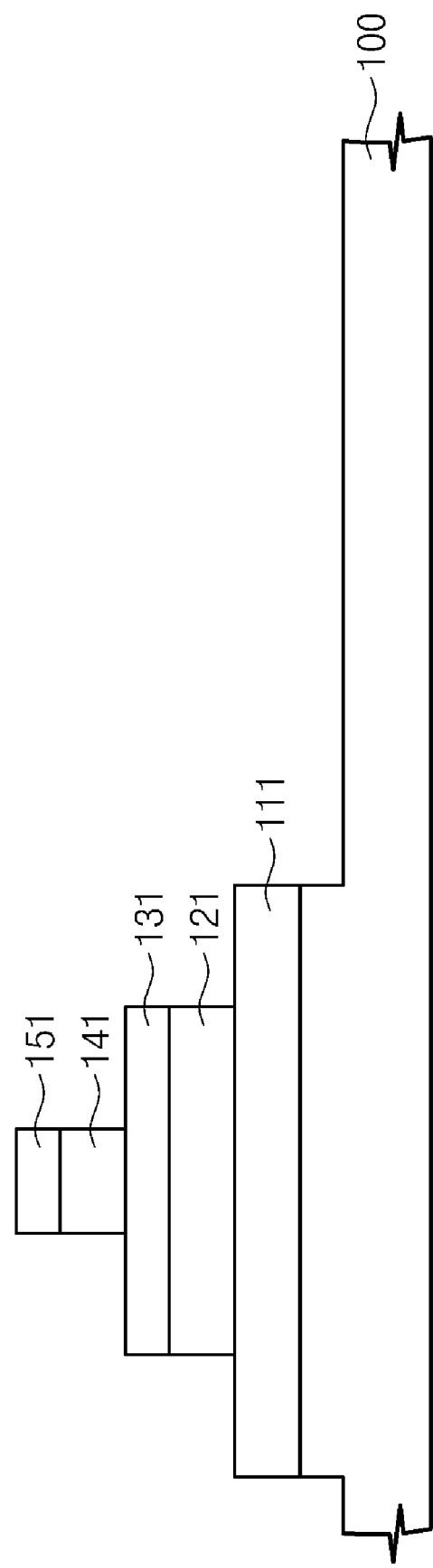

Referring to FIGS. 1 and 5, a Heterojunction Bipolar Transistor (HBT) is formed on a substrate 100 in operation S1. The substrate 100 may be a semi-insulating compound semiconductor substrate. For one example, the substrate 100 may be a GaAs or InP substrate. Referring to FIG. 2, a preliminary sub-collector layer 110, a preliminary collector layer 120, a preliminary base layer 130, a preliminary emitter layer 140, and a preliminary emitter cap layer 150 may be formed on the substrate 100. The layers 110 to 150 may be formed of a combination of a compound semiconductor including Group III-V elements such as GaAs, InP, InGaAs, InAlAs, InGaP, and AlGaAs to realize the HBT with respect to the substrate 100. For example, if the substrate 100 is formed of GaAs, the n+ preliminary sub-collector layer 110, the n preliminary collector layer 120 and the p+ preliminary base layer 130 are formed using GaAs, and the n AlGaAs preliminary emitter layer 140, and the n+ InGaAs preliminary emitter cap layer 150 are formed. The layers 110 to 150 may be formed using Molecular Beam Epitaxy (MBE) or Metal Organic Chemical Vapor Deposition (MOCVD).

Figure 3:
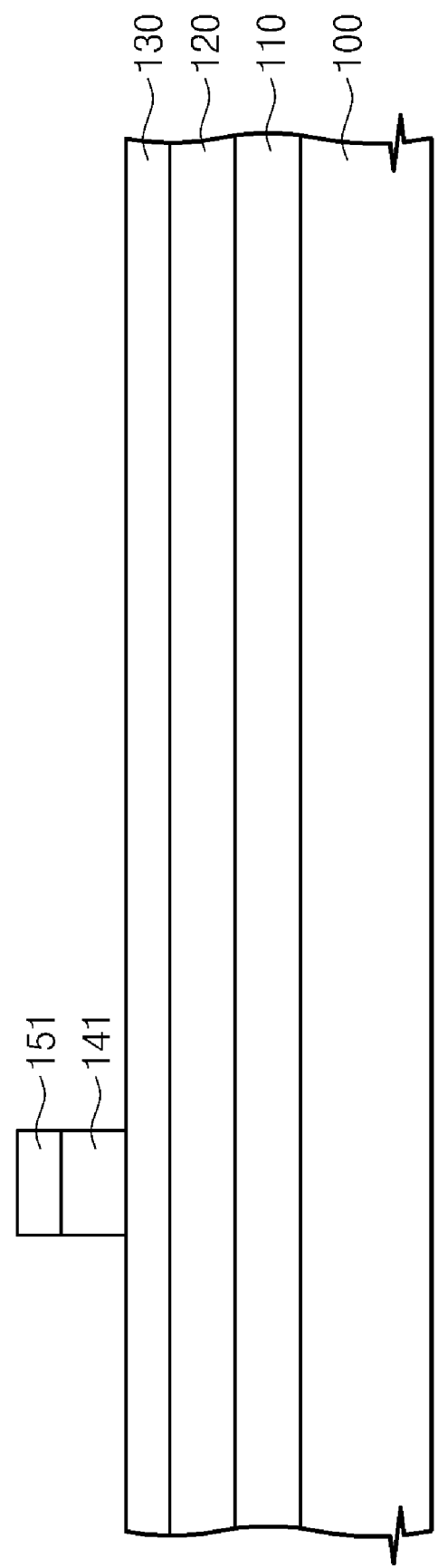

Referring to FIG. 3, the preliminary emitter cap layer 150 and the preliminary emitter layer 140 may be patterned. An emitter cap layer 151 and an emitter layer 141 are formed by the patterning process and the preliminary base layer 130 may be exposed. The patterning process may be a photolithography process.

Figure 4:
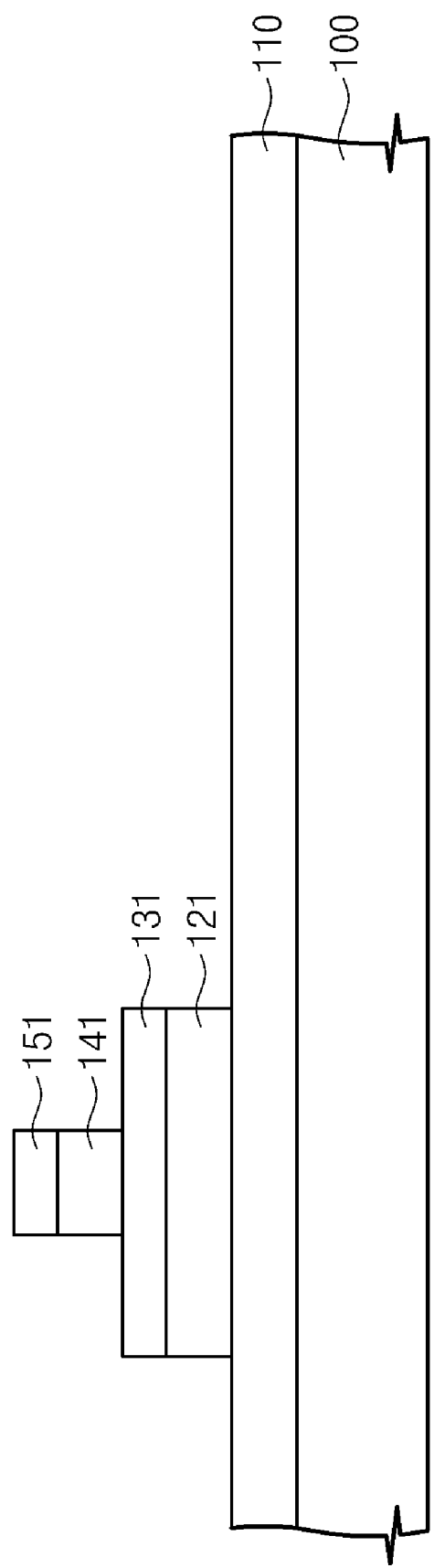

Referring to FIG. 4, the preliminary base layer 130 and the preliminary collector layer 120 may be patterned. The base layer 131 and the collector layer 121 are formed by the patterning process and the preliminary sub-collector layer 110 may be exposed. Referring to FIG. 5, the preliminary sub-collector layer 110 may be patterned. During the patterning process, a portion of the substrate 100 may be etched. A sub-collector layer 111 may be formed by the patterning process. The HBT may be formed by the patterning processes.

Figure 6:
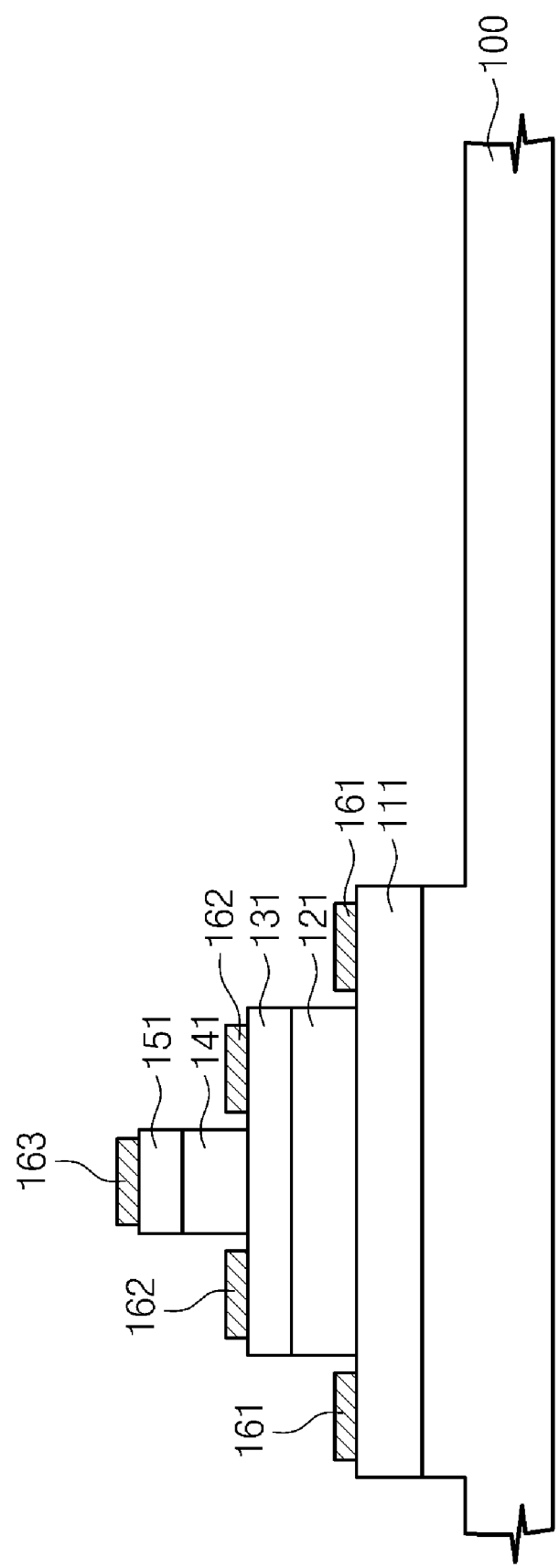
Figure 7:
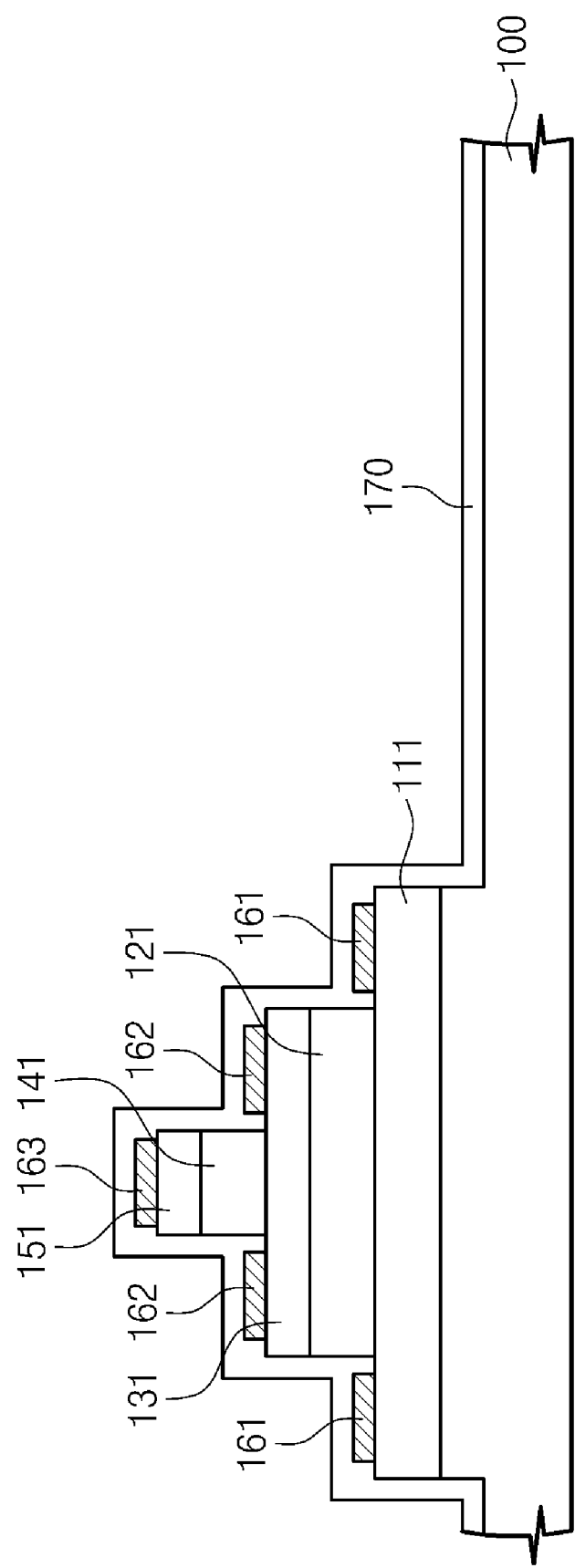

Referring to FIGS. 1 and 6, electrodes of the HBT may be formed in operation S2. The forming of the electrodes of the HBT includes forming a collector electrode 161 on the sub-collector layer 111, forming a base electrode 162 on the base layer 131, and forming an emitter electrode 163 on the emitter cap layer 151. The electrodes 161 to 163 may be formed using a lift off process. That is, a stencil pattern (not shown) is formed on the HBT to expose a portion where an electrode is formed, and then a metal layer (not shown) is deposited on the HBT. The metal layer on the stencil pattern may be removed together when the stencil pattern is removed. The electrodes 161 to 163 may include at least one of Ti, Pt, Au, and AuGe. Referring to FIGS. 1 and 7, a first insulation layer 170 is formed in operation S3. The first insulation layer 170 may be an oxide layer, a nitride layer, or an oxynitride layer. The first insulation layer 170 may be conformally formed on the substrate 100 through Chemical Vapor Deposition (CVD).

Figure 8:
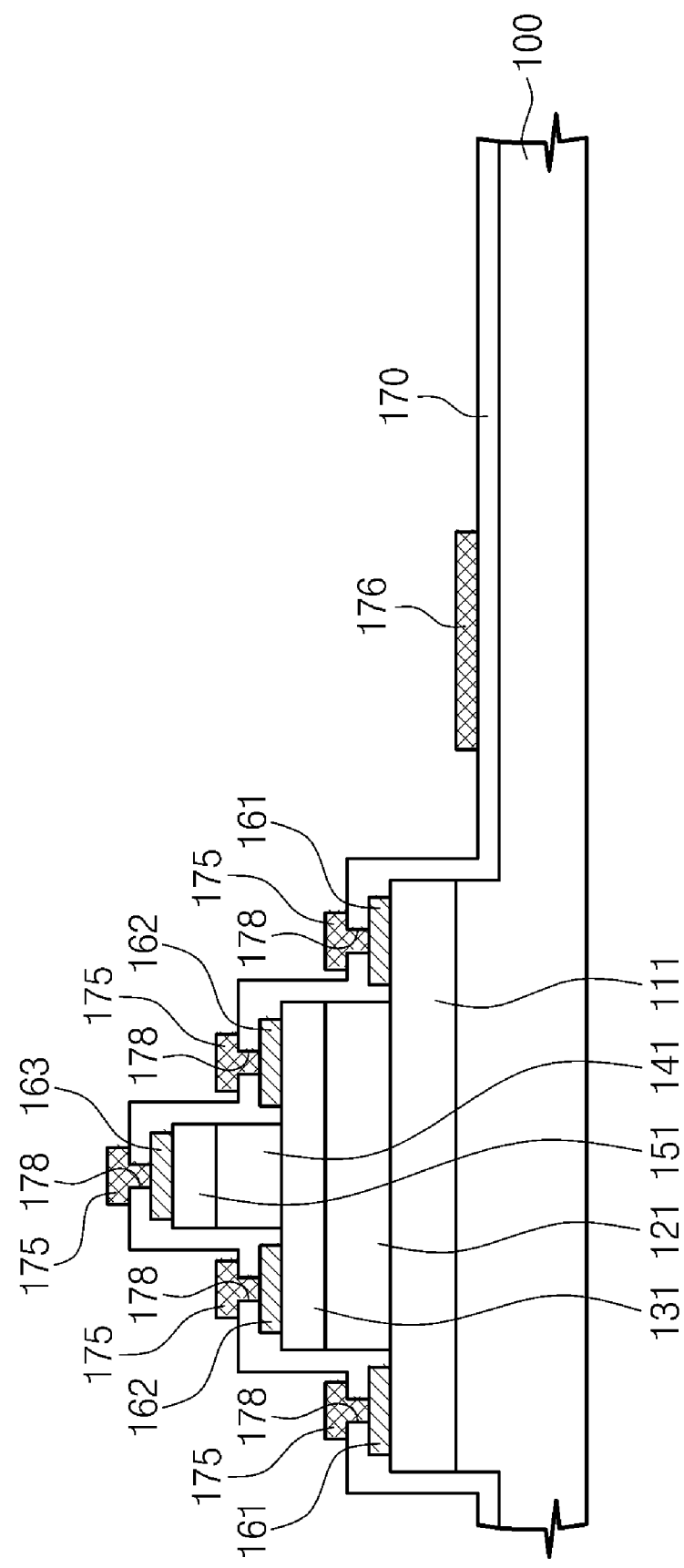
Figure 9:
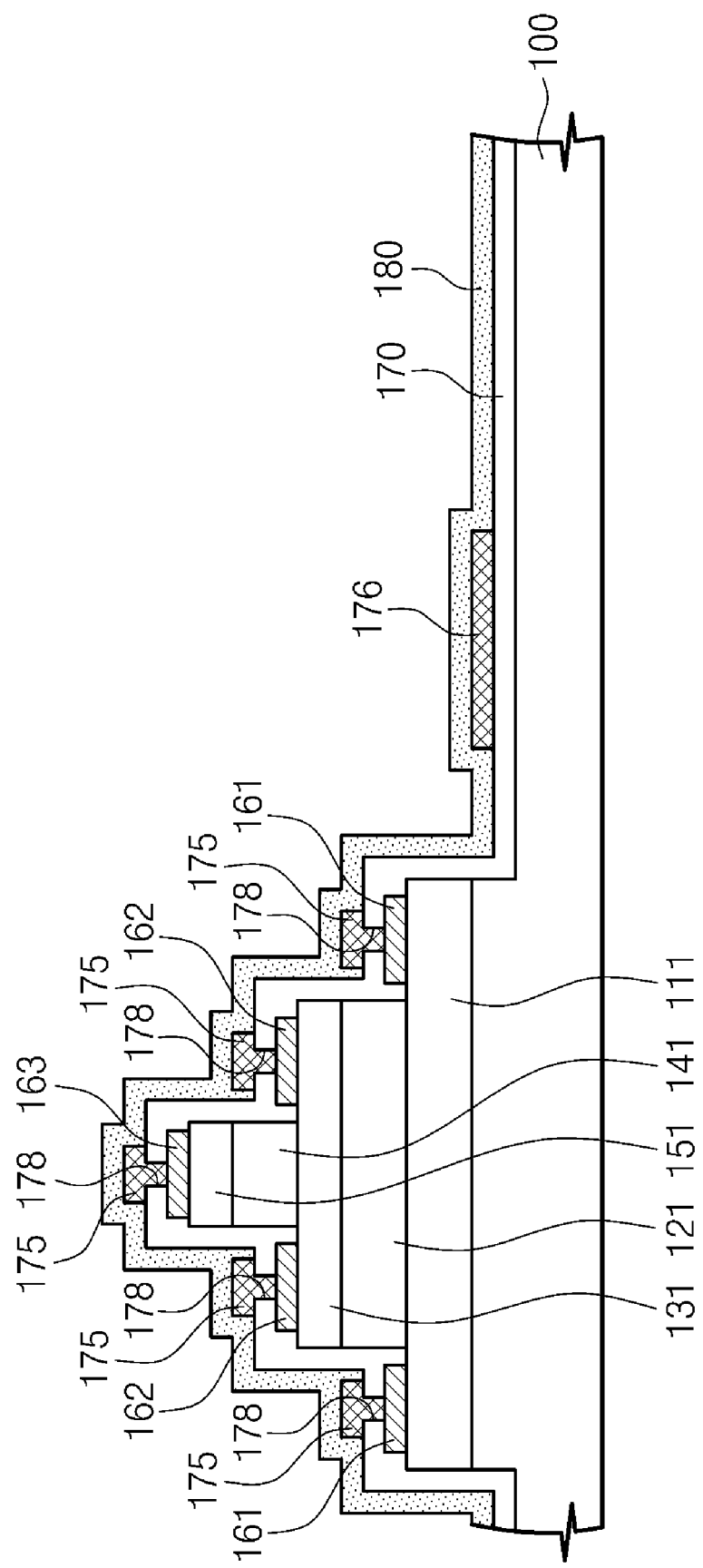

Referring to FIGS. 1 and 8, a wiring 175 of the HBT and a bottom electrode 176 of a capacitor may be formed with a first metal in operation S4. The wiring 175 of the HBT and the bottom electrode 176 of the capacitor may be formed of the same material simultaneously. The capacitor may be formed being spaced apart from the HBT on the substrate 100. The capacitor may be a Metal Insulator Metal (MIM) capacitor. A first via hole 178 may be formed in the first insulation layer 170. The wiring 175 of the HBT and the bottom electrode 176 may be formed simultaneously by a lift off process. The wiring 175 of the HBT may be formed to fill the first via hole 178. For example, the first metal may be Au. Referring to FIGS. 1 and 9, a second insulation layer 180 may be formed in operation S5. The second insulation layer 180 may be an oxide layer, a nitride layer, or an oxynitride layer. The second insulation layer 180 may be formed by a CVD process.

Figure 10:
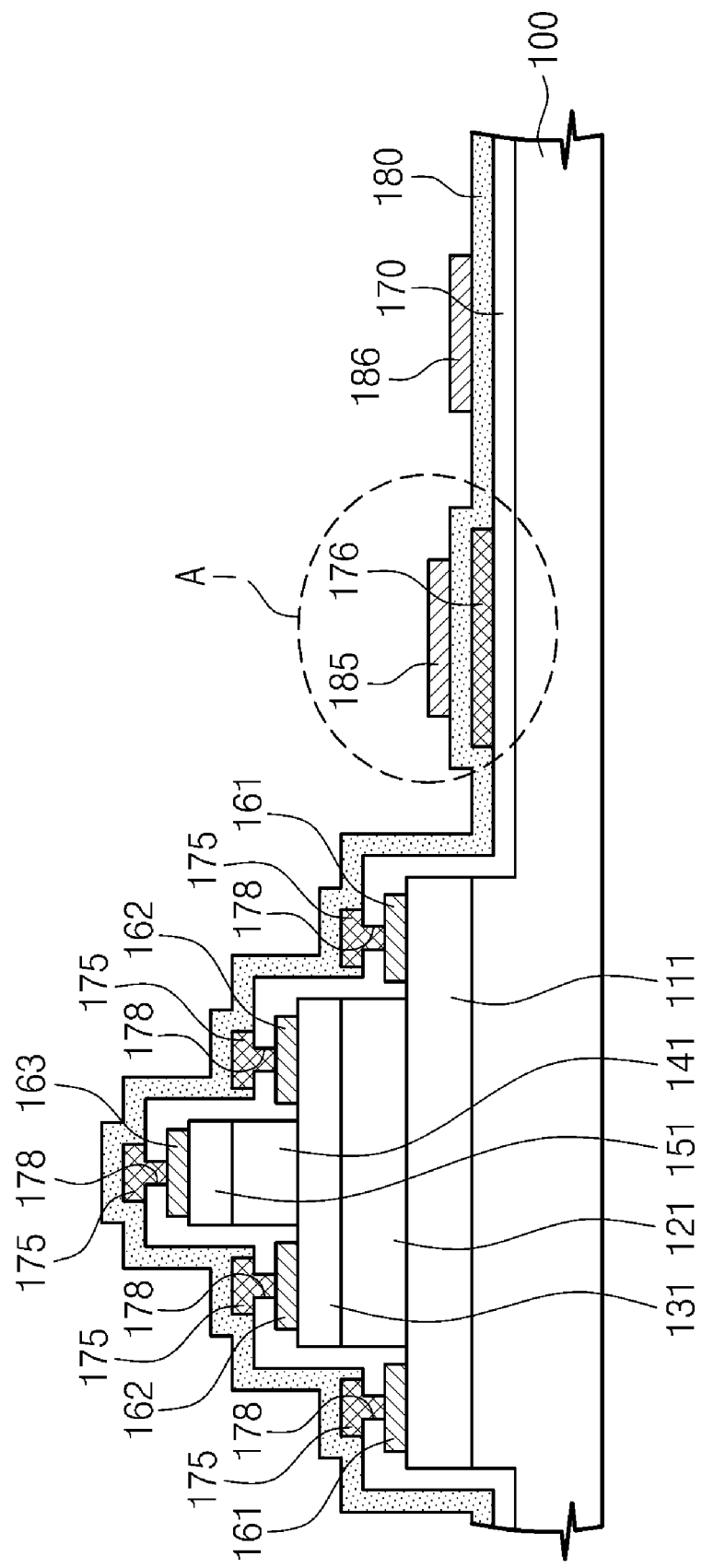

Referring to FIGS. 1 and 10, a top electrode 185 of the capacitor and a resistance pattern 186 may be formed with a second metal in operation S6. The top electrode 185 and the resistance pattern 186 may be formed of the same material simultaneously. The resistance pattern 186 may be formed being spaced from the capacitor on the substrate 100. The top electrode 185 may be formed thinner than the bottom electrode 176. The top electrode 185 and the resistance pattern 186 may be formed simultaneously by a lift off process. For example, the second metal may be NiCr or TaN.

Figure 11:
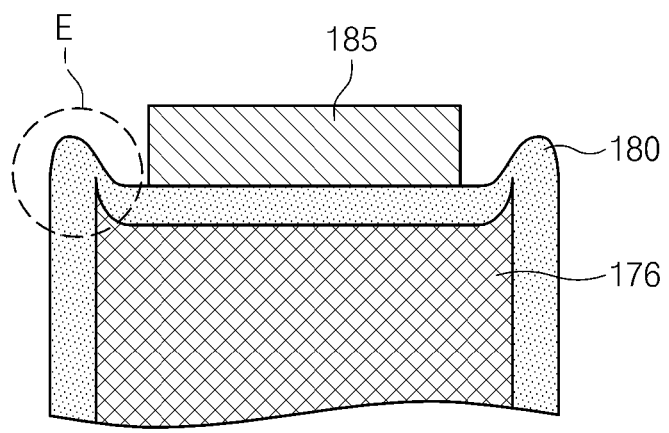
Figure 12:
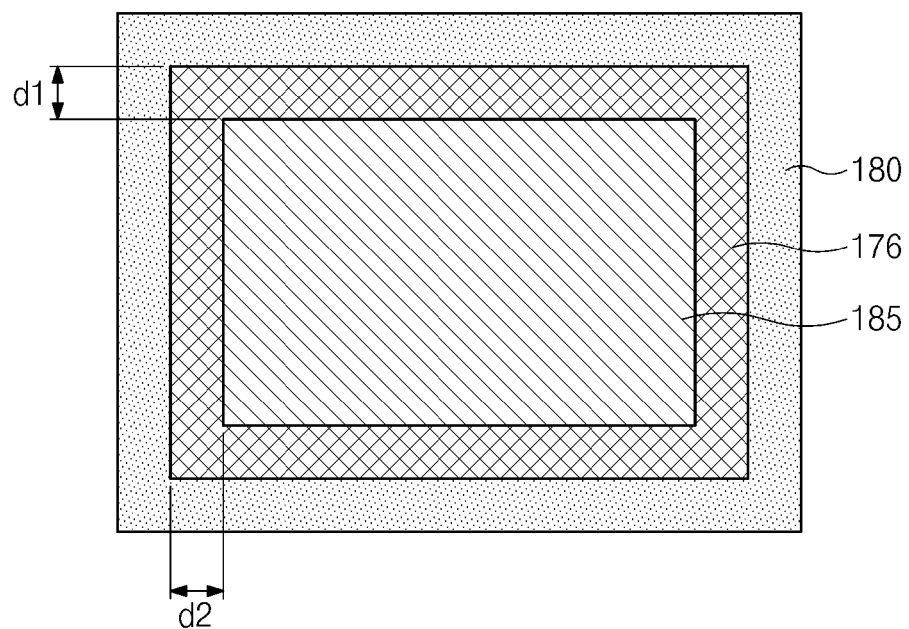

FIG. 11 is an enlarged view of a region A of FIG. 10. FIG. 12 is a plan view of the region A of FIG. 10. In the HBT for a power device, a breakdown voltage of the HBT may be increased in order to provide a high output according to a large current at a high operating voltage. The collector layer 121 may be formed thicker in order to increase the breakdown voltage. When the collector layer 121 is formed thickly, there is a great step height between the base electrode 162 and the collector electrode 161. The wiring 175 of the HBT may be disconnected when the step height is large and the electrodes 161 to 163 of the HBT are connected to the external through the wiring 175 of the HBT. Accordingly, the wiring 175 of the HBT may be formed thicker to prevent the disconnection. However, when the bottom electrode 176 is formed with the wiring 175 of the HBT as the present invention, the bottom electrode 176 may be formed thickly. If the bottom electrode 176 is thick, its edge portion may not be flat during the patterning process like a region E as shown in FIG. 11. That is, when the bottom electrode 176 is formed thickly during a lift off process, more metal may be deposited at a boundary region between the bottom electrode 176 and the metal pattern that will be removed. Accordingly, a shape shown in FIG. 11 may be obtained. The second insulation layer 180 used as an insulation layer of the capacitor may be formed thinly to increase the capacitance of the second insulation layer 180. Accordingly, when the width of the top electrode 185 is identical to or greater than the width of the bottom electrode 176, disconnection may occur at the edge portion E. According to an embodiment of the present invention, as shown in FIG. 12, the edge of the top electrode 185 may be formed being spaced by d1 and d2 from the edge of the bottom electrode 176. Accordingly, the above disconnection can be solved. The area of the top electrode 185 may be less than that of the bottom electrode 176. The d1 and d2 may be determined according to manufacturing conditions. For example, d1 and d2 may be the same.

Figure 13:
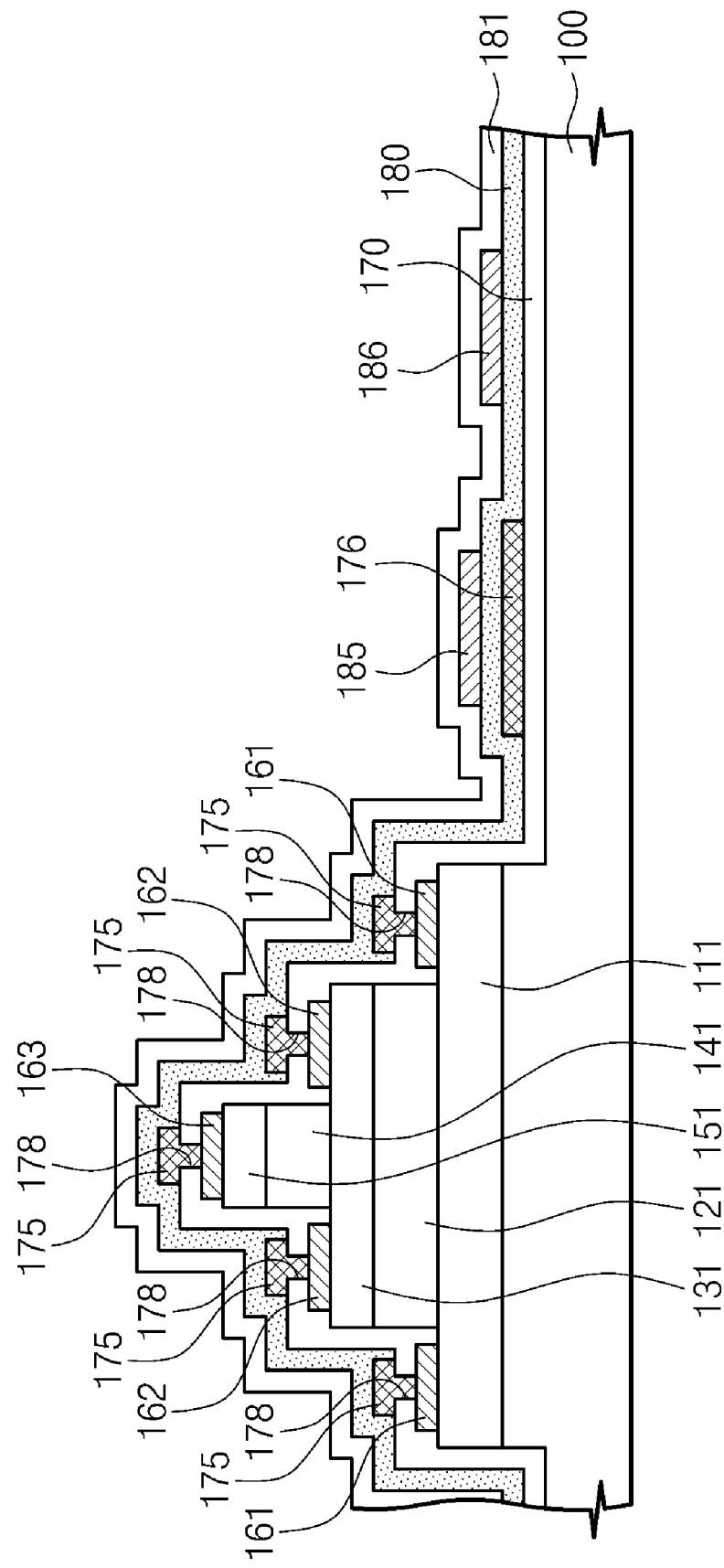
Figure 14:
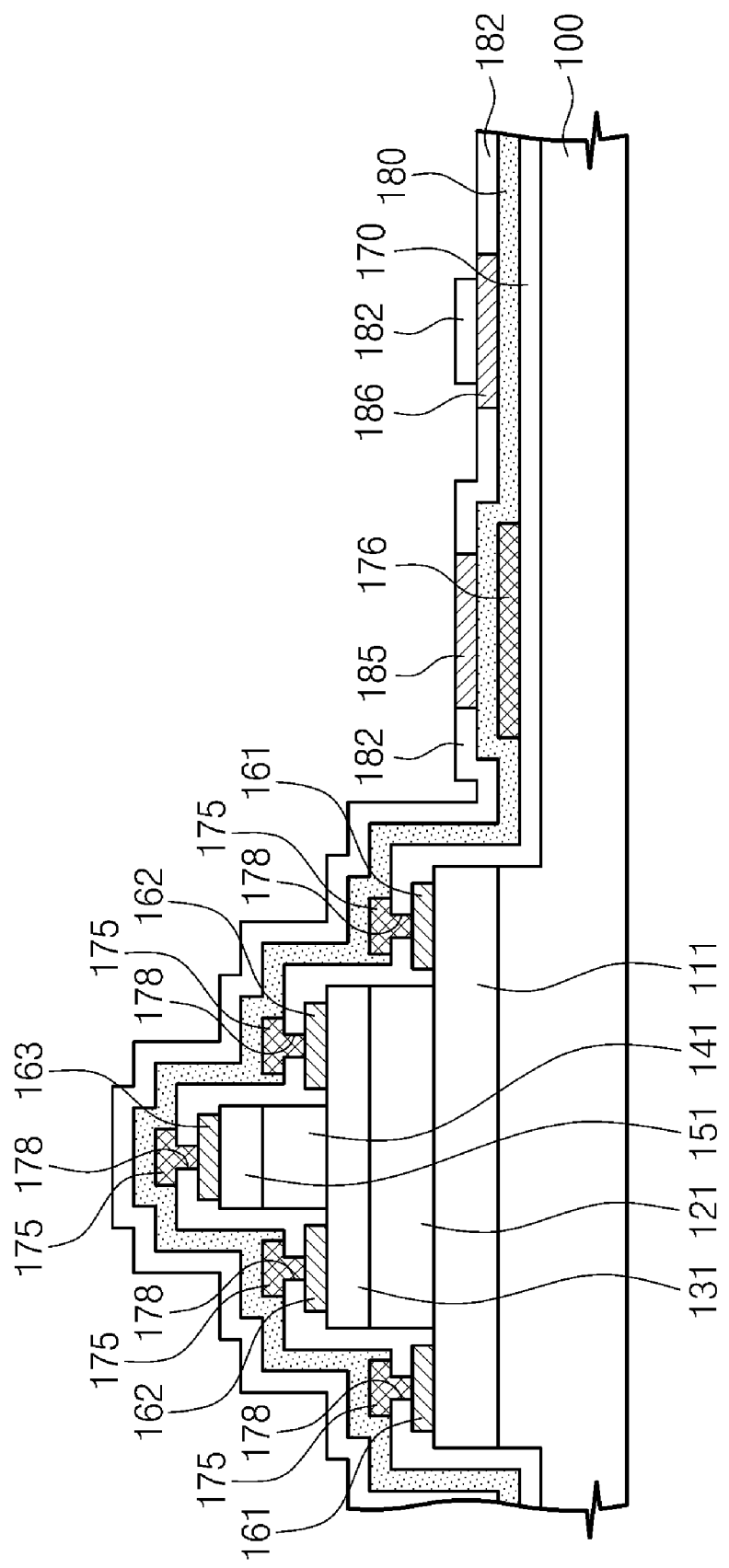

Referring to FIGS. 1 and 13, a third insulation layer 181 may be formed in operation S7. The third insulation layer 181 may be an oxide layer, a nitride layer, or an oxynitride layer. The third insulation layer 181 may be formed by a CVD process. Referring to FIG. 14, the third insulation layer 181 is patterned to form a third insulation pattern 182. At least a portion of a top surface of the top electrode 185 and a top surface of the resistance pattern 186 may be exposed by the patterning process.

Figure 15:
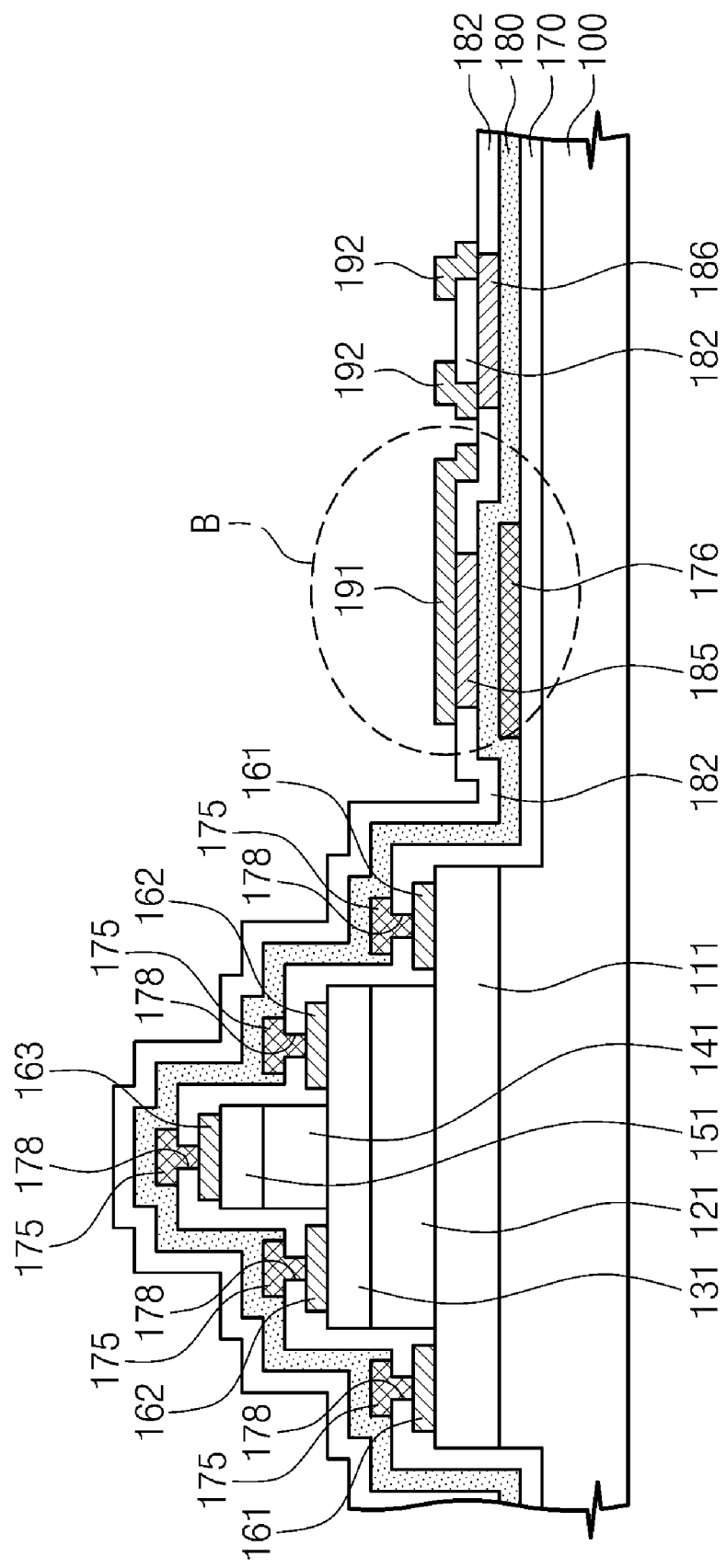
Figure 16:
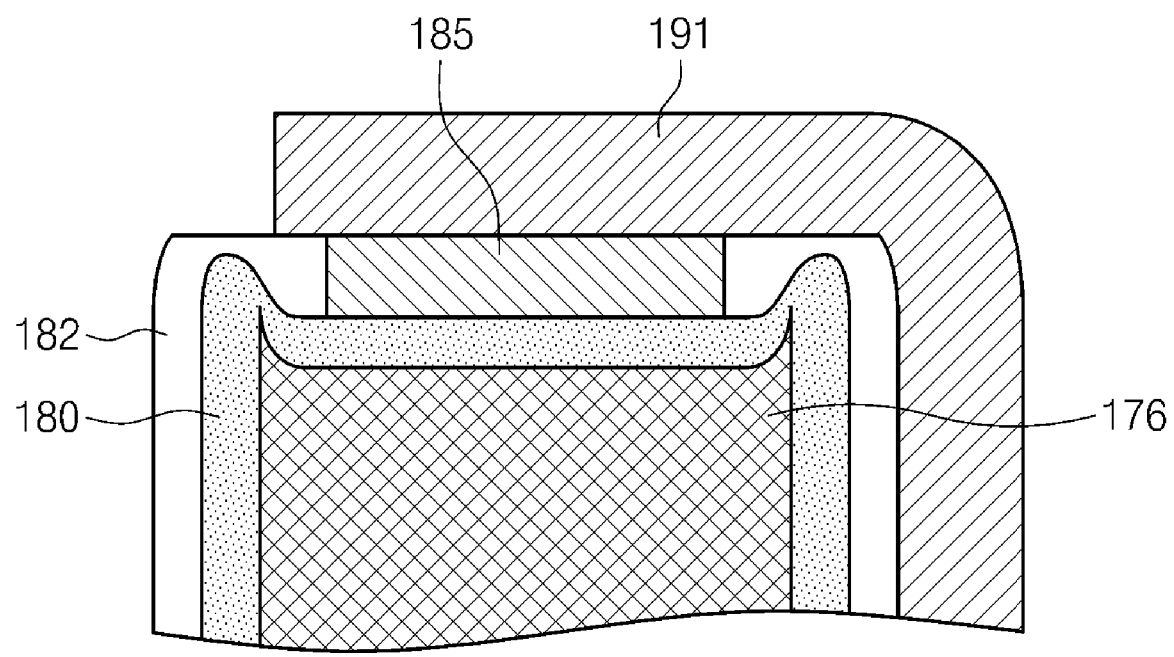

Referring to FIGS. 1 and 15, a wiring 191 of the capacitor and a wiring 192 of the resistance pattern 186 may be formed with a third metal in operation S8. The wring 181 of the capacitor and the wiring 192 of the resistance pattern 182 may be formed by a lift off process. For example, the third metal may be Au. The wiring 191 of the capacitor may contact the entire top surface of the top electrode 185. The wiring 192 of the resistance pattern 186 may be formed on a portion of the resistance pattern 186. FIG. 16 is an enlarged view of a region B of FIG. 15. In the structure according to an embodiment of the present invention, an additional insulation layer (e.g., the third insulation pattern 182) is provided between the wiring 191 of the capacitor and the bottom electrode 176, such that disconnection can be additionally prevented. Accordingly, stability of the above device can be obtained. In addition, the wiring 175 of the HBT and the bottom electrode 176 are formed together and the top electrode 185 and the resistance pattern 186 are formed together, such that processes can be simplified.

According to an embodiment of the present invention, a wiring of an HBT and a bottom electrode of a capacitor are simultaneously formed and also, a top electrode of a capacitor and a resistance pattern are simultaneously formed. Therefore, forming of an additional top electrode is unnecessary such that processes can be simplified. Additionally, a short circuit of the capacitor can be solved. As a result, a Monolithic Microwave Integrated Circuit (MMIC) having improved reliability can be manufactured.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for forming a monolithic microwave integrated circuit device, the method comprising:
   forming a Heterojunction Bipolar Transistor (HBT) on a substrate;
   forming a wiring of the HBT and a bottom electrode of a capacitor on the substrate, with a first metal, the bottom electrode being spaced apart from the HBT;
   forming a first insulation layer on the substrate to cover the HBT and the bottom electrode; and
   forming a top electrode of the capacitor on the first insulation layer and forming a resistance pattern on the substrate, with a second metal, the resistance pattern being spaced apart from the capacitor,
   wherein the top electrode and the resistance pattern are formed of the same material simultaneously, and
   wherein an edge of the top electrode is spaced apart from an edge of the bottom electrode.

2. The method of claim 1, wherein an area of the top electrode is less than that of the bottom electrode.

3. The method of claim 1, further comprising:
   forming a second insulation layer on the top electrode;
   exposing a top surface of the top electrode by patterning the second insulation layer; and
   forming a capacitor wiring on the top electrode and forming a resistance pattern wiring on the resistance pattern, with a third metal.

4. The method of claim 1, wherein the forming of the HBT comprises:
   sequentially forming a preliminary sub-collector layer, a preliminary collector layer, a preliminary base layer, a preliminary emitter layer, and a preliminary emitter cap layer on the substrate; and forming a sub-collector layer, a collector layer, a base layer, an emitter layer, and an emitter cap layer by patterning the preliminary sub-collector layer, the preliminary collector layer, the preliminary base layer, the preliminary emitter layer, and the preliminary emitter cap layer.

5. The method of claim 4, further comprising a collector electrode, a base electrode, and an emitter electrode on the sub-collector layer, the base layer, and the emitter cap layer, respectively.

6. The method of claim 5, wherein the forming of the collector electrode, the base electrode, and the emitter electrode is performed using a lift off process.

7. The method of claim 5, after the forming of the collector electrode, the base electrode, and the emitter electrode, further comprising conformally forming a third insulation layer to cover the collector electrode, the base electrode, and the emitter electrode.

8. The method of claim 7, further comprising exposing at least a portion of a top surface of the collector electrode, the base electrode, and the emitter electrode by forming a via hole in the third insulation layer.

9. The method of claim 1, wherein the forming of the wiring of the HBT and the forming of the bottom electrode of the capacitor on the substrate, with the first metal, and the forming of the top electrode of the capacitor on the first insulation layer and the forming of the resistance pattern on the substrate, with the second metal, are performed using a lift off process.

10. The method of claim 1, wherein the top electrode is formed being thinner than the bottom electrode.

* * * * *